United States Patent
Hopkins, II et al.

(10) Patent No.: US 6,717,965 B2
(45) Date of Patent: Apr. 6, 2004

(54) GRADED THIN FILM WEDGE INTERFERENCE FILTER AND METHOD OF USE FOR LASER TUNING

(75) Inventors: George William Hopkins, II, Sunnyvale, CA (US); Nathan Lee Shou, San Francisco, CA (US); Mark McDonald, Milpitas, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/900,412

(22) Filed: Jul. 6, 2001

(65) Prior Publication Data

US 2003/0012230 A1 Jan. 16, 2003

(51) Int. Cl.$^7$ ................................. H01S 3/10
(52) U.S. Cl. ........................................ 372/20
(58) Field of Search .............................. 372/20, 92, 98

(56) References Cited

U.S. PATENT DOCUMENTS

| | | | |
|---|---|---|---|
| 6,108,355 A | | 8/2000 | Zorabedian |
| RE37,044 E | | 2/2001 | Wu |
| 6,192,058 B1 | | 2/2001 | Abeles |
| 6,205,159 B1 | | 3/2001 | Sesko et al. |
| 6,205,270 B1 | * | 3/2001 | Cao ............ 385/24 |
| 6,246,480 B1 | | 6/2001 | O'Brien |

OTHER PUBLICATIONS

International Search Report, Oct. 24, 2002.
Macleod, H. A. in *Thin Film Optical Filters* 2$^{nd}$ Edition, McGraw–Hill, 1989, pp. 244–269 (no month).

Rosenberg, K. P., et al., "Logarithmically Variable Infrared Etalon Filters," SPIE, vol. 2262/223, pp. 223–232 (Sep. 1994).

Scobey M. and Stupik P., "Stable Ultra–Narrow Bandpass Filters," SPIE, vol. 2262, pp. 37–46 (Sep. 1994).

Siegman A. E., "An Introduction to Lasers and Masers," McGraw–Hill, Inc., 1971 (no month).

Takashashi, H., Temperature Stability of Thin–Film Narrow–Bandpass Filters Produced by Ion–Assisted Deposition, Applied Optics, vol. 34, No. 4, Feb. 1, 1995.

Zhang, X.X., "An Interference Filter Based External Cavity Laser For Dense Wavelength Division Multiplexing Applications," Corning OCA Corp., pp. 103–108. (no date).

Siegman A. E., "Lasers," 1986 Univ. Science Books (no month).

* cited by examiner

*Primary Examiner*—James Davie
(74) *Attorney, Agent, or Firm*—Blakely, Sokoloff, Taylor & Zafman LLP (57) ABSTRACT

A laser employing a tapered, thin film interference filter as a tuning element. Tapered, thin film interference filters employing dielectric layers are disclosed for use in tuning lasers. Methods of tuning a laser by adjustably positioning a tapered thin film interference filter are disclosed. Also included are a method for tuning a laser to account for thermal wavelength drift, a method of mounting an etalon in a substantially stress free manner, and a mount therefor.

28 Claims, 7 Drawing Sheets

GRADED THIN FILM WEDGE INTERFERENCE FILTER AND METHOD OF USE FOR LASER TUNING

FIELD OF THE INVENTION

The invention relates generally to the field of optical lasers, and more particularly to the tuning of wavelength emissions from a laser.

BACKGROUND OF THE INVENTION

Fiberoptic telecommunications are continually subject to demand for increased bandwidth. One way that bandwidth expansion has been accomplished is through dense wavelength division multiplexing (DWDM) wherein multiple separate data streams exist concurrently in a single optical fiber, with modulation of each data stream occurring on a different channel. Each data stream is modulated onto the output beam of a corresponding semiconductor transmitter laser operating at a specific channel wavelength, and the modulated outputs from the semiconductor lasers are combined onto a single fiber for transmission in their respective channels. The International Telecommunications Union (ITU) presently requires channel separations of 50 GHz, or approximately 0.4 nanometers. This channel separation allows up to 128 channels to be carried by a single fiber within the bandwidth range of currently available fibers and fiber amplifiers. Improvements in fiber technology together with the ever-increasing demand for greater bandwidth will likely result in smaller channel separation in the future.

Transmitter lasers used in DWDM systems have typically been based on distributed feedback (DFB) lasers operating with a reference etalon associated in a feedback control loop, with the reference etalon defining the ITU wavelength grid. Statistical variation associated with the manufacture of individual DFB lasers results in a distribution of channel center wavelengths across the wavelength grid, and thus individual DFB transmitters are usable only for a single channel or a small number of adjacent channels. Continuously tunable external cavity lasers have been developed to overcome this problem.

The trend towards smaller channel separation and the advent of channel selectivity in transmitter lasers has given rise to a need for greater accuracy and control in the positioning of tunable elements associated with transmitter lasers. As tunable elements are configured for narrower channel separation, decreasing component tolerances and thermal fluctuation become increasingly important. Non-optimal positioning of tunable elements results in spatial losses and reduced transmitter output power.

The use of an air-spaced etalon for the tuning of external cavity lasers has been attempted. Such an etalon is constructed from two pieces of glass each having a high-reflectance (HR) coated surface and an anti-reflection (AR) coated surface. The high reflectance surfaces of the two pieces are placed facing one another and are separated by a spacer. The spacer is formed using tiny drops of epoxy filled with precision glass beads. This type of etalon is not dimensionally stable, even over short time spans, making it difficult to use the laser for any extended period of time without recalibrating it.

SUMMARY OF THE INVENTION

The invention relates to tunable external cavity lasers and improvements in tuning elements therefor. The invention comprises, in general terms, a tunable laser configured to use a graded thin film interference filter as a channel selector. An external cavity laser according to the present invention incorporates a gain medium and a tapered, thin film interference filter. The external cavity laser may additionally comprise an external reflective element, a grid generator element and a collimator. The grid generator element, collimator and tapered, thin film interference filter may be aligned in an optical path between the gain medium and the external reflective element.

A driver may be operably connected to the tapered, thin film interference filter and adapted to adjustably position it in the optical path. One method of adjusting the tuning element or tuning the laser includes linearly translating the thin film interference filter in directions normal to the optical path, although other methods of tuning include rotating a circular variable filter in the optical path, or tilting a filter in the optical path.

The tapered, thin film interference filter according to the invention may comprise a tapered half wave spacer layer, a tapered first quarter wave layer stack positioned adjacent a first side of said half wave spacer layer, and a tapered second quarter wave layer stack positioned adjacent a second side of said half wave spacer layer.

A tapered, thin film interference filter according to the invention may include more than one spacer layer. Each spacer layer, whether one or more is employed, has an optical wavelength which is an odd integral multiple of a half wavelength of light to be passed therethrough, and each side thereof is adjacent a tapered layer stack.

A tuning element for an external cavity laser is disclosed, which includes a tapered thin film interference filter including a tapered half wave spacer layer, a tapered first quarter wave layer stack positioned adjacent a first side of the half wave spacer layer, and a tapered second quarter wave layer stack positioned adjacent a second side of the half wave spacer layer.

A method for tuning an external cavity laser according to the invention may include providing a tapered thin film interference filter including a tapered half wave spacer layer, a tapered first quarter wave layer stack positioned adjacent a first side of the half wave spacer layer, and a tapered second quarter wave layer stack positioned adjacent a second side of the half wave spacer layer, and adjustably positioning the tapered thin film interference filter in an optical path defined by a beam associated with the external cavity laser.

Adjustment of the position may include translating the thin film interference filter in at least one direction substantially normal to the optical path. Alternatively, adjustment of the positioning of the filter may include rotating the thin film interference filter in a plane substantially normal to the optical path, or tilting the thin film interference filter by rotating it about an axis substantially normal to the optical path.

A method for tuning an external cavity laser is disclosed to include generating a first table of position locations, at a baseline temperature, to move a tuning element to respective desired wavelengths to be emitted from the external cavity laser, storing data values representative of the first table in non-volatile memory; generating a second table of position location adjustments to be made relative to a range of variations in temperature surrounding the baseline temperature, storing data values representative of the second table in non-volatile memory; obtaining a gross position of the tuning element in accordance with a wavelength desired to be emitted from the laser by accessing the first table and selecting the position location stored for the desired wavelength; measuring a temperature of the environment surrounding the tuning element; obtaining a position location adjustment value from the second table that corresponds to the temperature measured; and determining position correction to finely adjust the gross position, and moving the tuning element to the finely adjusted position, thereby accurately tuning the laser to emit the desired wavelength.

A method of mounting a tuning filter or etalon in a substantially stress free manner is disclosed to include the provision of a rigid mount having a multiplicity of pads, including a central pad mounted thereon, wherein the central pad has a recessed support surface, relative to support surfaces defined on a remainder of the multiplicity of pads. A substantially non-shrinking adhesive is applied on the recessed support surface, wherein the adhesive builds to the height of the central pad to be substantially equal to height of the support surfaces on the remainder of the multiplicity of pads. The etalon is then mounted by placing a bottom end of the etalon on the pads, whereby the adhesive bonds to a central portion of the end of the etalon.

DETAILED DESCRIPTION OF THE INVENTION

Referring more specifically to the drawings, for illustrative purposes the present invention is embodied in the apparatus and method shown in FIG. 1 through FIG. 7. It will be appreciated that the apparatus may vary as to configuration and as to details of the parts, and that the method may vary as to details and the order of events, without departing from the basic concepts as disclosed herein. The invention is disclosed primarily in terms of use with an external cavity laser. However, it will be readily apparent to those skilled in the art that the invention may be used with other laser devices or systems. It also should be understood that the terminology used herein is for the purpose of describing particular embodiments only, and is not intended to be limiting.

Figure 1:
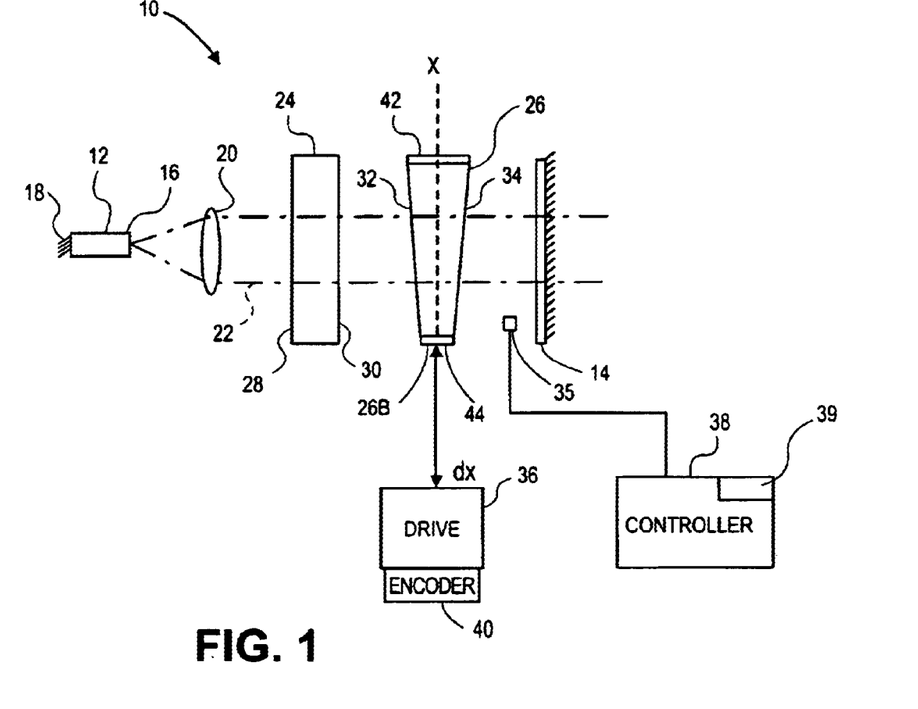
FIG. 1 is a schematic diagram of an external cavity laser apparatus utilizing a thin film wedge etalon as a tunable element.

The invention will be more fully understood by first discussing the operation of a continuously tunable external cavity laser in which the invention may be employed. Referring to FIG. 1, there is shown external cavity laser apparatus 10. The apparatus 10 includes a gain medium 12 and an end or external reflective element 14. Gain medium 12 may comprise a conventional Fabry-Perot diode emitter chip and has an anti-reflection (AR) coated front facet 16 and a partially reflective rear facet 18. Retroreflective element 14 may comprise an end mirror. The external laser cavity is delineated by rear facet 18 and end mirror 14. Gain medium 12 emits a coherent beam from front facet 16 that is collimated by lens 20 to define an optical path 22 which is co-linear with the optical axis of the external cavity. Front and rear facets 16, 18 of gain medium 12 are aligned with the optical axis of the external cavity as well. Conventional output coupler optics (not shown) are associated with rear facet 18 for coupling the output of external cavity laser 10 into an optical fiber (also not shown).

The external cavity laser 10 includes a grid generator element and a tunable element, which are respectively shown in FIG. 1 as a grid etalon 24 and a wedge etalon channel selector 26 positioned in optical path 22 between gain medium 12 and end mirror 14. Grid etalon 24 typically is positioned in optical path 22 before tunable element 26, and has parallel reflective faces 28, 30. Grid etalon 24 operates as an interference filter, and the refractive index of grid etalon 24 and the optical thickness of grid etalon 24 as defined by the spacing of faces 28, 30 give rise to a multiplicity of peaks of maximum transmission within the communication band at wavelengths which coincide with the center wavelengths of a selected wavelength grid which may comprise, for example, the ITU (International Telecommunications Union) grid. Other wavelength grids may alternatively be selected. Grid etalon has a free spectral range (FSR) which corresponds to the spacing between the grid lines of the ITU grid, and the grid etalon 24 thus operates to provide a plurality of pass bands centered on each of the gridlines of the wavelength grid. Grid etalon 24 has a finesse (free spectral range divided by full width half maximum or FWHM) which suppresses neighboring modes of the external cavity laser between each channel of the wavelength grid.

Grid etalon 24 may be a parallel plate solid, liquid or gas spaced etalon, and may be tuned by precise dimensioning of the optical thickness between faces 28, 30 by thermal expansion and contraction via temperature control. The grid etalon 24 may alternatively be tuned by tilting to vary the optical thickness between faces 28, 30, or by application of an electric field to an electro-optic etalon material.

Wedge etalon 26 also acts as an interference filter, with non-parallel reflective faces 32, 34 providing a tapered shape. Wedge etalon 26 may be a Fabry-Perot etalon filter constructed from a solid spacer layer having a stack of thin, dielectric films on each side as discussed in more detail below with reference to FIG. 4. The wedge etalon 26 is only one example of a tunable element which may be used in accordance with the invention in an external cavity laser. For example, a circular variable etalon filter may also be used to practice the methods according to the present invention. Such a circular variable etalon filter may be made from a solid spacer layer and stacks of thin films on each side. However, variation in thickness of the device change circumferentially, as opposed to linearly with the wedge etalon 26.

The relative size, shape and distances between the various optical components of external cavity laser 10 are in some instances exaggerated for clarity and are not necessarily shown to scale. External cavity laser 10 may include additional components (not shown), such as focusing and collimating components, and polarizing optics configured to remove spurious feedback associated with the various components of external cavity laser 10.

The pass bands defined by the wedge etalon 26 are substantially broader than the pass bands of the grid etalon 24, with the broader pass bands of the wedge etalon 26 having a periodicity substantially corresponding to the separation between the shortest and longest wavelength channels defined by the grid etalon 24. In other words, the free spectral range of the wedge etalon 26 corresponds, at a minimum, to the full wavelength range of the wavelength grid defined by grid etalon 24, and typically to the wavelengths for which the laser medium has appreciable gain. The wedge etalon 26 has a finesse which suppresses channels adjacent to a particular selected channel.

The wedge etalon 26 is used to select between multiple communication channels by changing the optical thickness between faces 32, 34 of wedge etalon 26. This is achieved by translating or driving wedge etalon 26 along axis x, which is parallel to the direction of taper of wedge etalon 26 and perpendicular to optical path 22 and the optical axis of external cavity laser 10. Each of the pass bands defined by the wedge etalon 26 supports a selectable channel, and as the wedge is advanced or translated into optical path 22, the beam traveling along optical path 22 passes through increasingly thicker portions of wedge etalon 26 which support constructive interference between opposing faces 32, 34 at longer wavelength channels. As wedge etalon 26 is withdrawn from optical path 22, the beam will experience increasingly thinner portions of wedge etalon 26 and expose pass bands to the optical path 22 which support correspondingly shorter wavelength channels. The free spectral range of wedge etalon 26 corresponds to the complete wavelength range of grid etalon 24 as noted above, so that a single loss minimum within the communications band can be tuned across the wavelength grid. The combined feedback to gain medium 12 from the grid etalon 24 and wedge etalon 26 support lasing at the center wavelength of a selected channel. Across the tuning range, the free spectral range of the wedge etalon 26 is broader than that of grid etalon 24.

Wedge etalon 26 is positionally tuned via a tuning assembly which comprises a drive element 36 structured and configured to adjustably position wedge etalon 26 according to selected channels. Drive element 36 may comprise a stepper motor together with suitable hardware for precision translation of wedge etalon 26. Drive element may alternatively comprise various types of actuators, including, but not limited to, DC servomotors, solenoids, voice coil actuators, piezoelectric actuators, ultrasonic drivers, shape memory devices, and like linear actuators.

Drive element 36 is operatively coupled to a controller 38 which provides signals to control the positioning of wedge etalon 26 by drive element 36. Controller 38 may include a data processor and memory (not shown) wherein are stored lookup tables of positional information for wedge etalon 26 which correspond to selectable channel wavelengths. Controller 38 may be internal to driver element 36, or may be external and shared in other component positioning and servo functions of the invention as described below.

When external cavity laser 10 is tuned to a different communication channel, controller 38 signals drive element 36 according to positional data in the look up table, and drive element 36 translates or drives wedge etalon 26 to the correct position wherein the optical thickness of the portion of the wedge etalon 26 positioned in optical path 22 provides constructive interference which supports the selected channel. A linear encoder 40 may be used in association with wedge etalon 26 and drive element 36 to ensure correct positioning of wedge etalon 26 by driver 36.

During tuning of wedge etalon 26, the length of the laser external cavity may also be tuned by positional adjustment of end mirror 14 using another tuning mechanism (not shown) which may comprise a DC servomotor, solenoid, voice coil actuator, piezoelectric actuator, ultrasonic driver, shape memory device, or other type of actuator. In certain embodiments, end mirror 14 may be positioned using selective heating or cooling of a compensating element coupled to the end mirror, as disclosed in U.S. patent application Ser. No. 09/900,443 entitled "Laser Apparatus with Active Thermal Tuning of End Mirror" to inventors Rice et al., filed concurrently herewith commonly assigned and incorporated herein by reference. The tuning of an external laser cavity with an electro-optic element according to error signals derived from voltage monitored across a gain medium is described in U.S. patent application Ser. No. 09/900,426 entitled "Evaluation and Adjustment of Laser Losses According to Voltage Across Gain Medium" to inventors Daiber et al., filed concurrently herewith commonly assigned and incorporated herein by reference.

Wedge etalon 26 may include opaque regions 42, 44 at its ends that are optically detectable and which serve to verify the position of wedge etalon 26 when it has been positionally tuned to its longest or shortest channel wavelength. Opaque regions 26 may be coated on surface 32 and/or surface 34 and provide an encoder mechanism usable in the positional tuning of wedge etalon, effectively functioning, in conjunction with the laser beam, as an optical interrupt switch. Since the switch is integral to the etalon 26 and laser beam, however, it offers improved accuracy in position reading due to the absence of intervening structures between the etalon 26 and an external switch, and it does so with a reduction in the number of parts needed with a concurrent reduction in cost of the assembly. When wedge 26 is moved into a position such that one of opaque regions 42, 44 enters optical path 22, the opaque region 42, 44 will block or attenuate the beam along the optical path. This attenuation of light is detectable, as described further below. Since the location of opaque regions 42, 44 on wedge etalon 26 can be determined with precision, controller 38 can anticipate when an opaque region 42, 44 will enter optical path 22. Appearance of an opaque region 42, 44 in optical path 22 at a point other than predicted will indicate an encoder error, and the controller 38 can make an appropriate correction based on the detected presence of an opaque region 42, 44 in optical path 22. Additional opaque regions (not shown) may be included elsewhere on wedge etalon 26.

Figure 2A:
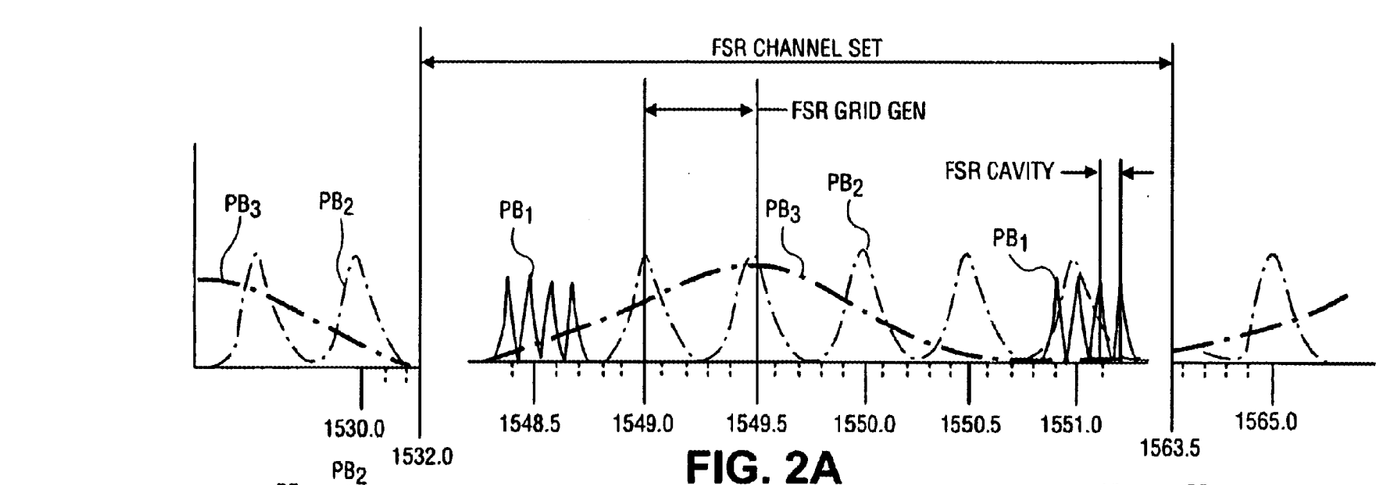
FIGS. 2A–2C are graphical illustrations of pass band characteristics of the external cavity laser of FIG. 1 for the wedge etalon, grid etalon and external cavity with respect to a selected channel in a wavelength grid.
Figure 2B:
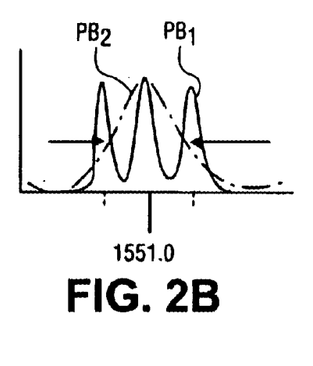
Figure 2C:
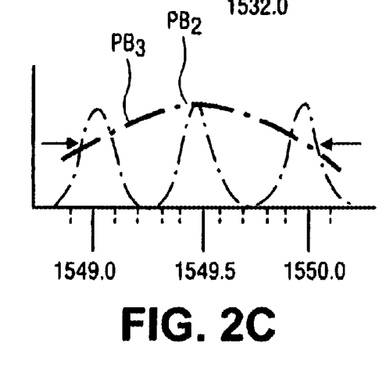

The pass band relationship of the grid etalon 24, wedge etalon 26 and the external cavity defined by rear facet 18 and end mirror 14 are illustrated graphically in FIG. 2A through FIG. 2C, which show external cavity pass bands PB1 (also called cavity modes), grid etalon pass bands PB2, and wedge etalon pass bands PB3. Relative gain is shown on the vertical axis and wavelength on the horizontal axis. As can be seen, free spectral range of the wedge etalon 26 ($FSR_{Channel\ Sel}$) is greater than the free spectral range of the grid etalon 24 ($FSR_{Grid\ Gen}$), which in turn is greater than the free spectral range of the external cavity ($FSR_{cavity}$). The band pass peaks PB1 of the external cavity periodically align with the center wavelengths of pass bands PB2 defined by the wavelength grid of grid etalon 24. There is one pass band peak PB3 from the wedge etalon 26 which extends over all of the pass bands PB2 of the wavelength grid. In the specific example shown in FIGS. 2A–2C, the wavelength grid extends over sixty four channels spaced apart by one half nanometer (nm) or 62 GHz, with the shortest wavelength channel at 1532 nm, and the longest wavelength channel at 1563.5 nm.

The finesse of grid etalon 24 and wedge etalon 26 determine the attenuation of neighboring modes or channels. As noted above, finesse is equal to the free spectral range over the full width half maximum, or finesse=FSR/FWHM. The width for a grid etalon pass band PB2 at half maximum is shown in FIG. 2B, and the width for a wedge etalon pass band PB3 at half maximum is shown in FIG. 2C. The positioning of grid etalon 24 and wedge etalon 26 within the external cavity improves side mode suppression.

Figure 3A:
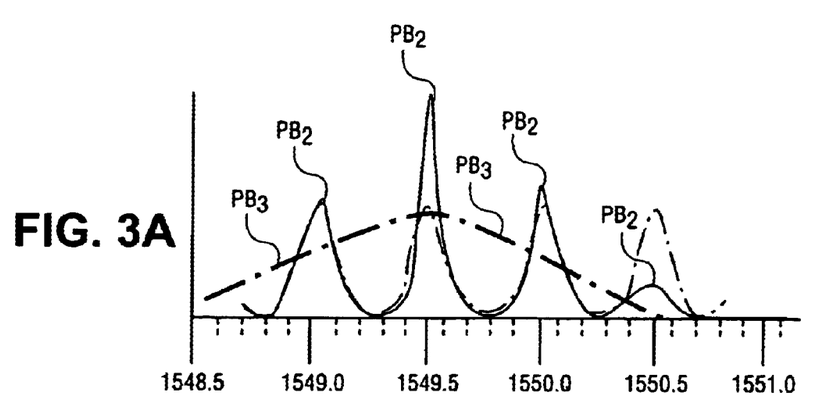
FIGS. 3A–3C are graphical illustrations of gain response to tuning of the external cavity laser of FIG. 1 for a plurality of channels in a wavelength grid.
Figure 3B:
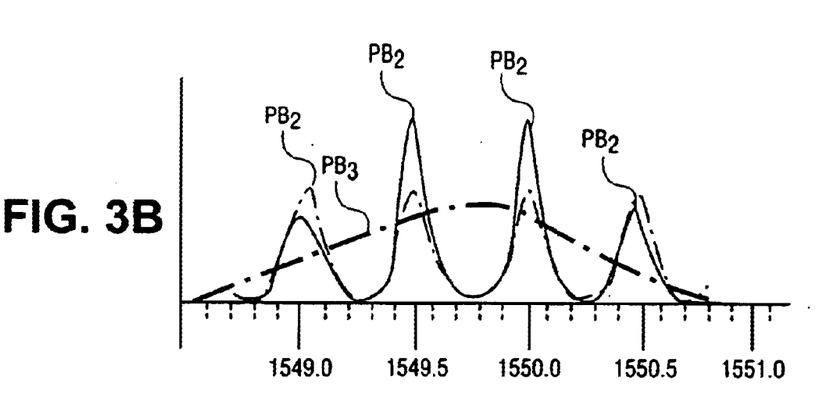
Figure 3C:
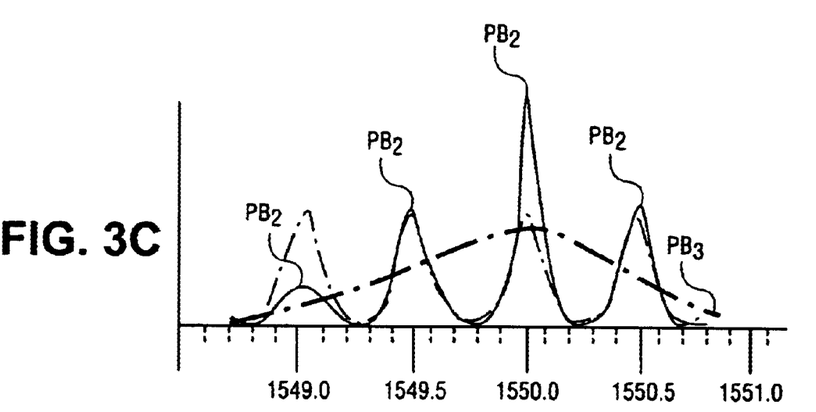

The tuning of the band pass PB3 of wedge etalon 26 between a channel centered at 1549.5 nm and an adjacent channel at 1550 nm is illustrated graphically in FIGS. 3A–3C, wherein the selection of a channel generated by grid etalon 24 and the attenuation of adjacent channels or modes is shown. The external cavity pass bands PB1 shown in FIGS. 2A–2C are omitted from FIGS. 3A–3C for clarity. The grid etalon 24 selects periodic longitudinal modes of the external cavity corresponding to the grid channel spacing while rejecting neighboring modes. The wedge etalon 26 selects a particular channel in the wavelength grid and rejects all other channels. The selected channel or lasing mode is stationary at one particular channel for filter offsets in the range of approximately plus or minus one half channel spacing. For larger channel offsets the lasing mode jumps to the next adjacent channel.

Figure 4:
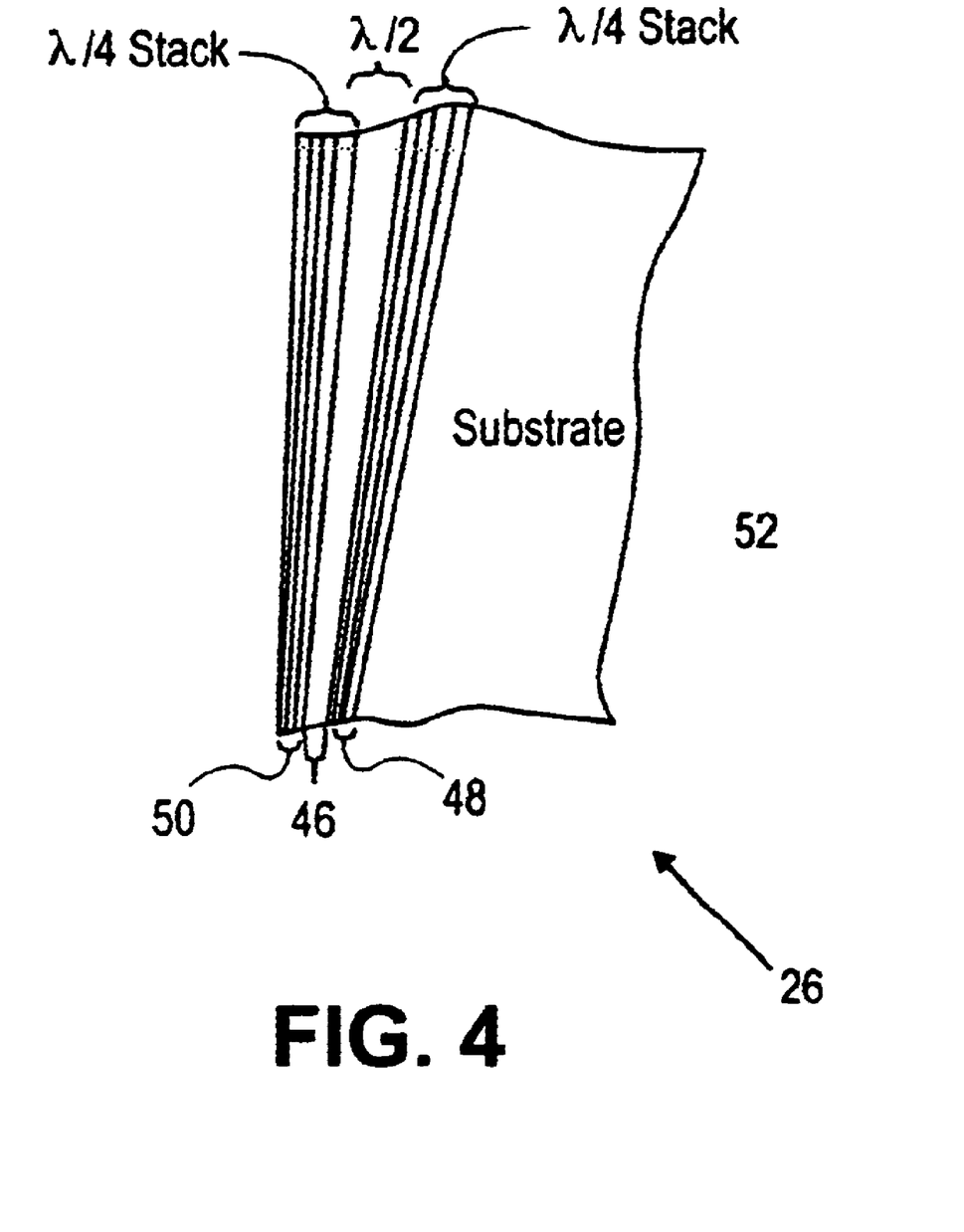
FIG. 4 is an exaggerated schematic view in cross section of a thin film wedge etalon usable with the present invention.

The need for greater bandwidth in telecommunications systems will require narrower channel spacing and, accordingly, more sophisticated tunable elements. FIG. 4 shows a wedge etalon 26 fabricated as a thin film device. The device is based on the interference of light. The device includes of stacks of alternating thin dielectric films. Such films are described by optical thickness in fractions of a wavelength of light. The dielectrics are classed into low-index (L) layers, typically silica, and high-index (H) layers, typically metal oxides of metals such as tantalum, titanium, or niobium, for example. Index refers to the optical index of refraction.

A spacer layer 46 which comprises a single half wave ($\lambda/2$) layer (half wave optical thickness, HWOT), or an odd integral multiple of one half-wavelength optical thickness. The spacer layer may be made of a low index (L) material, such as silica, or a high index (H) material. Neither material gives significant optical performance over the other, but the use of a high index material reduces the dependence of pass band wavelength shift of the device relative to the angle of incidence of the laser beam on the device. Thus, for applications where the etalon is tilted for purposes of tuning, use of a high index material reduces the degree of tilting required to obtain the same wavelength shift comparably with use of a low index material. However, the temperature dependence of the center wavelength of the pass band can vary depending on whether a high index material or low index material is employed for the spacer element 46.

As noted, the spacer layer 46 may be any odd integral multiple of one half-wavelength optical thickness, e.g., ½, 3/2, 5/2, 7/2 . . . , etc. The choice of a higher order optical thickness changes the far out-of-pass band characteristics of the etalon. Thus, a higher order layer may be chosen to obtain particular out-of-pass band characteristics at the expense of a thicker etalon. Further, an etalon according to the present invention is not to be limited to one spacer layer surrounded by two ¼ wave layer stacks, more than one spacer layer may be employed, where the spacer layers are each separated from one another by a ¼ wave stack as described. When more than one spacer layer is employed, the spacer layers typically, but not necessarily have the same thickness. That is, the thicknesses may vary by an odd integral multiple of one half wavelength.

The layers 48, 50 on either side of the spacer layer 46 are similar to one another and may be alternating pairs of quarter-wavelength optical thickness layers of high-index and low-index materials. The layers on either side typically differ in one layer only, because one side faces the substrate 52, and the other side faces air. Half wave layer 46 and quarter wave stacks 48, 50 are formed by thin film deposition on the surface of a transparent substrate 52. The depositions may be performed by ion beam sputtering or rotary magnetron sputtering for example.

The interference filter/etalon 26 must have particular properties in order to perform its function. First, the transmission pass band of the device must have sufficiently high transmission at the center of the pass band in order to permit an adequate external cavity reflectivity, when the pass band for the desired wavelength is centered on the beam in the laser cavity. The transmission pass band must have a sufficiently low transmission for adjacent modes of the etalon 26, which selects wavelengths, so that radiation at these wavelengths is adequately suppressed. These are conflicting requirements. The transmission of an ideal, thin-film, Fabry-Perot, interference filter, at the center of its pass band, and with no wedge, is 100 percent. The transmission at the center of the pass band of a wedged filter is less than 100 percent. Transmission depends on the full width at half maximum of the basic filter design and the ratio of the beam size to the tuning rate of the device. The reduction of transmission below 100 percent is due to the filter being tuned away from the wavelength of the laser beam, as determined by the wavelength generating etalon, over most of the laser beam, due to the wedge of the filter. Only the line at the center of the beam and perpendicular to the direction of wedge has 100 percent transmission for a perfect filter.

The basic filter design can be calculated as described by Macleod, H. A. in *Thin Film Optical Filters* $2^{nd}$ Edition, McGraw-Hill, 1989, on pages 244–269, which is incorporated herein by reference. Filter design may also be carried out by using any of a number of thin-film design programs such as TFCalc or Thin Film Design Software for Windows, available from Software Spectra, Inc., Portland, Oreg. The transmission of the device can then be calculated by integrating the product of the transmission band pass value at any point on the filter and the normalized irradiance of the laser beam at that point, over the extent of the laser beam.

The method of determining the optimum filter characteristics starts with determining the performance requirements and constraints. Requirements include the minimum allowable transmission at the position of maximum transmission for a laser beam, and the required suppression of the adjacent modes from the wavelength selector etalon. Constraints include the wavelengths that the device must be able to tune, the size of the laser beam, and the length of scan possible for the device.

If the scan is linear, the scan rate or tuning ratio, typically in nm/mm, is the wavelength range divided by the length of scan. The linear scan defines the minimum scan rate. Real filters may deviate from their actual design due to normal manufacturing variation, and the filters may be more or less non-linear due to variations in layer thickness, such that the scan rates may be greater than or less than the linear rate at some locations along the filter. Real filters also may have losses in transmission due to variation in film thickness from the design values due to normal manufacturing errors, from scattering at film interfaces, and/or from absorption of light within the layers. Such losses can represent a few percent for a well-made filter. It is typical to allow as much as 10 percent loss for manufacturing variation, scattering, absorption, and other factors affecting filter performance.

The design process begins by setting values based on allowances for the laser. Due to package constraints, a typical maximum scan distance is 18 mm. The wavelength range is also determined by the application. A typical laser for the telecommunications C-Band may cover, for example, 1528 nm to 1565 nm, or a span of 37 nm. The size of the laser beam can be varied by using different focal length lenses to shape the beam. However, the choice of lens is constrained by the wavelength of light defined by the particular use of the invention and by the natural spreading of a Gaussian laser beam due to diffraction. See Hecht, Eugene, et al., *Optics* 3$^{rd}$ Edition, Addison-Wesley 1997, for a discussion of Gaussian laser beams, such discussion being incorporated herein by reference. With the degenerate resonator cavity and a length of 18 mm, a practical beam size at the device is 0.38 mm across the $1/e^2$ points, where e is the base of natural logarithms. The designer can choose a small range around this value by using a lens with an appropriate focal length. The desired external cavity reflectivity leads to a minimum peak transmittance of 78 percent for the device. The design reflectivity should therefore be about 88 percent or greater to account for absorption, scatter and manufacturing errors.

The full width at half maximum of the pass band of the filter needs to be 1.5 nm or less in order to suppress the adjacent wavelengths passed by the etalon, which defines the allowed wavelengths, by 55 dB or more. This was determined empirically by constructing and testing physical models, for which the separation of the adjacent wavelengths was 0.4 nm. We determined these values from a constructed model, because we were unable to determine the required full width at half maximum with a mathematical model. The shape of the pass band needs to be that of a single-cavity or a multiple, aligned-cavities, Fabry-Perot filter, for which the shape from the peak to the half-power points is approximately Gaussian or Lorentzian.

The theoretical transmission for a filter with a scan rate of 3.0 nm/mm would be 88 percent, determined by the integration process, already described, for a pass band with a 1.5 nm full width at half maximum. A pass band much less than 1.5 nm would be undesirable, because it would have a peak transmission less than the required 78 percent, with an allowance of 10 percent for absorption, scatter, and manufacturing errors. The full width at half maximum is therefore required to be greater than 1.0 nm and less than 1.5 nm. The scan rate is required to be less than or equal to 3.0 nm/mm. We could meet these requirements with a linear scan that is 14 mm or greater. We could operate with a laser beam, which is 0.40 mm or less in diameter across the $1/e^2$ points.

Half wave layer 46 and quarter wave stacks 48, 50 are tapered in thickness in order to define a "wedge" shape. The actual "wedge" may be the half wave layer 46, with quarter wave stacks 48, 50 providing reflective or partially reflective surfaces therefore. A portion of the substrate 52 may have only antireflective coatings on two opposing sides and none of the layers 48, 46 and 50, forming a non-filtered portion (not shown) This non-filtered portion can allow the laser beam to pass unfiltered and thereby provide calibration signals or signals which may be used to perform diagnostic tests.

The relative thickness of layers 46, 48, 50 as shown in FIG. 4 are exaggerated for clarity, and the degree of taper is greatly exaggerated. Channel selection for external cavity laser 10 can be carried out within a tuning range of about 1530 nm to 1565 nm using the thin film wedge etalon of FIG. 4. As a specific example, wedge etalon 26 is about 18 millimeters long, and the thickness of half wave layer 46 is about 510 nm at the narrow end, and about 518 nm thick at the wide end of wedge etalon 26, so that half wave layer 46 is tapered in thickness by eight nanometers over a length of 18 millimeters. In general, wedge etalon 26 will need to define 100 different communication channels, and half wave layer 46 will provide 100 different transmission zones (not shown) corresponding to the 100 selectable channels. For an eighteen-millimeter long wedge etalon 26 and a beam width of 360 microns, the individual zones will be separated by a distance of 180 microns. The coefficient of thermal expansion of the materials of the half wave layer 46, quarter wave layers 48, 50 and substrate 52 are selected to minimize dimensional fluctuation within a standard operating temperature range.

Figure 5:
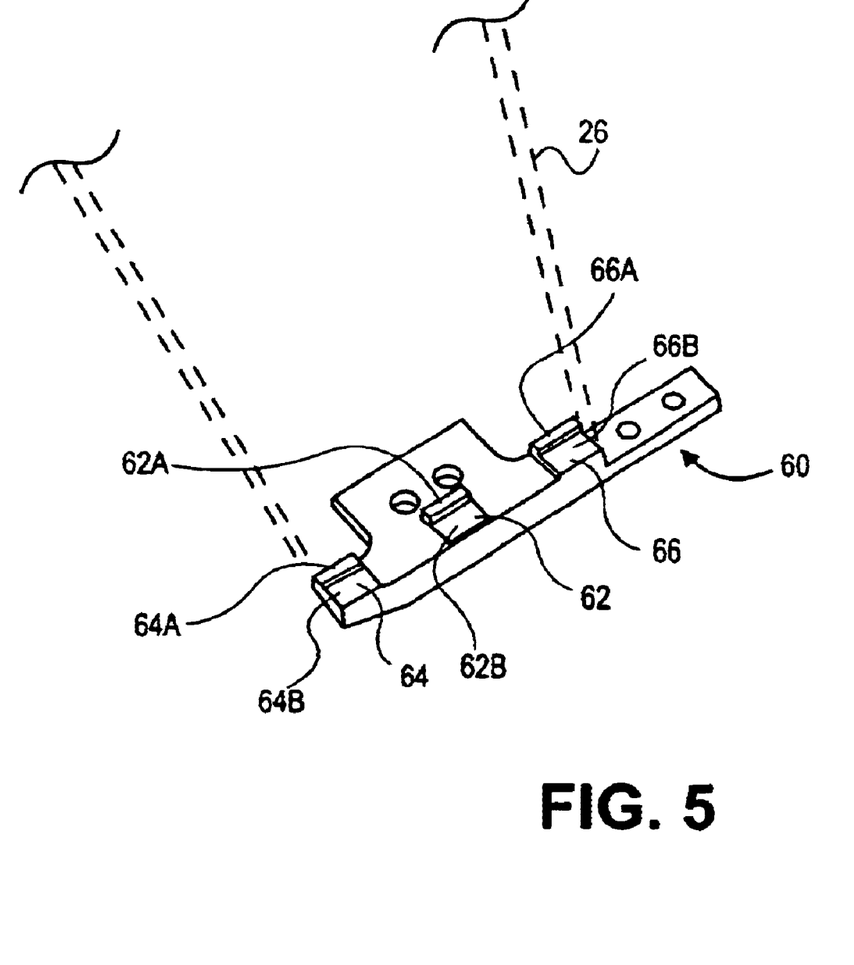
FIG. 5 is a perspective view of a mount to which an etalon (a portion of which is shown in phantom) may be mounted.

The etalon 26 is mounted on a mount 60 by which the etalon is driven. Mount 60 may be made of metal such as AISI 416 stainless steel. However, any material that exhibits mechanical and thermal properties sufficient for this application may be employed, such as Covar (an iron-nickel alloy with a coefficient of thermal expansion to match common borosilicate glasses) for example. Polymers which are sufficiently dimensionally stable and exhibit mechanical and thermal properties sufficient for this application may also be used, and may also reduce the cost of the design. Coefficients of thermal expansion in the components of the present invention must be very small or compensate for one another. Dimensional stability is a key factor in the proper functioning of the present invention. The wavelength calibration of the laser will change over a period of years due to dimensional instability. Heat treatment and annealing of the mount may be carried out in order to minimize any contribution to dimensional instability by the mount 60. A key consideration in mounting the etalon is the minimization of stress imposed on the etalon 26. A single point attachment is made substantially on the center of the bottom 26b, of the etalon 26. As shown in FIG. 5, metal mount 60 is provided with a central pad 62 and a pair of similar pads 64 and 66, adjacent the central pad 62. All three pads may be formed of the same material, which may be the same material as the mount and may be integral with the mount.

Each pad 62,64,66 is provided with a raised shoulder 62a,64a,66a which facilitates the positioning of the etalon 26 during mounted as described in more detail below. The main surface 62b of pad 62 is recessed to a level slightly below the levels of the main surfaces 64b and 66b which are equal in height. The recessed surface 62b is provided to accommodate the volume of an adhesive which is used to secure pad 62 to a central portion of the bottom end 62b of etalon 62. A typical adhesive is a filled epoxy with about 80–95% (by weight) silica fill, typically about 90%. A silica fill as described minimizes shrinkage of the epoxy as it cures. The shrinkage from application to full curing is only about 0.25% of the original volume of the adhesive when applied. It should be noted here that the present invention is not limited to the use of epoxy with 90% silica fill, as other extremely low shrink adhesives, as well as other low stress attachment means could be used o accomplish the fixation.

The mounting of the etalon 26 on mount 60 is accomplished by first applying an adhesive to the main surface 62b of pad 62. A volume of at least about 0.5 mg is required for a complete joint. A volume of about 0.5 to 1.2 mg is typically used, often about 1.0 mg, to account for manufacturing errors that may exist in the parts to be joined. The etalon is next positioned by centering the bottom end 26b over the central pad 62. Shoulders 62a,64a,66a facilitate the proper positioning of etalon 26 as a side of the etalon (adjacent an edge of the bottom surface 26b) abuts the shoulders when properly placed. The volume of adhesive applied to surface 62a levels the height of this surface with surfaces 64a and 66a. Additionally, since negligible shrinkage is involved upon curing of the adhesive, the bottom surface 26b is supported by the three pads and connected through a "single point" attachment, with very little stress applied along any portion of the bottom surface 26 of the etalon. Of course the single point cannot be a point in reality, but is a very small dimension. The central pad 62 is typically about 3 mm wide and about 3.5 mm long (although these dimensions can be varied, as would be readily apparent to those of ordinary skill in the art) and therefor provides a very small area of attachment. A portion of the etalon 26 is shown in phantom in FIG. 5 to aid in visualizing the orientation of attachment.

Figure 6:
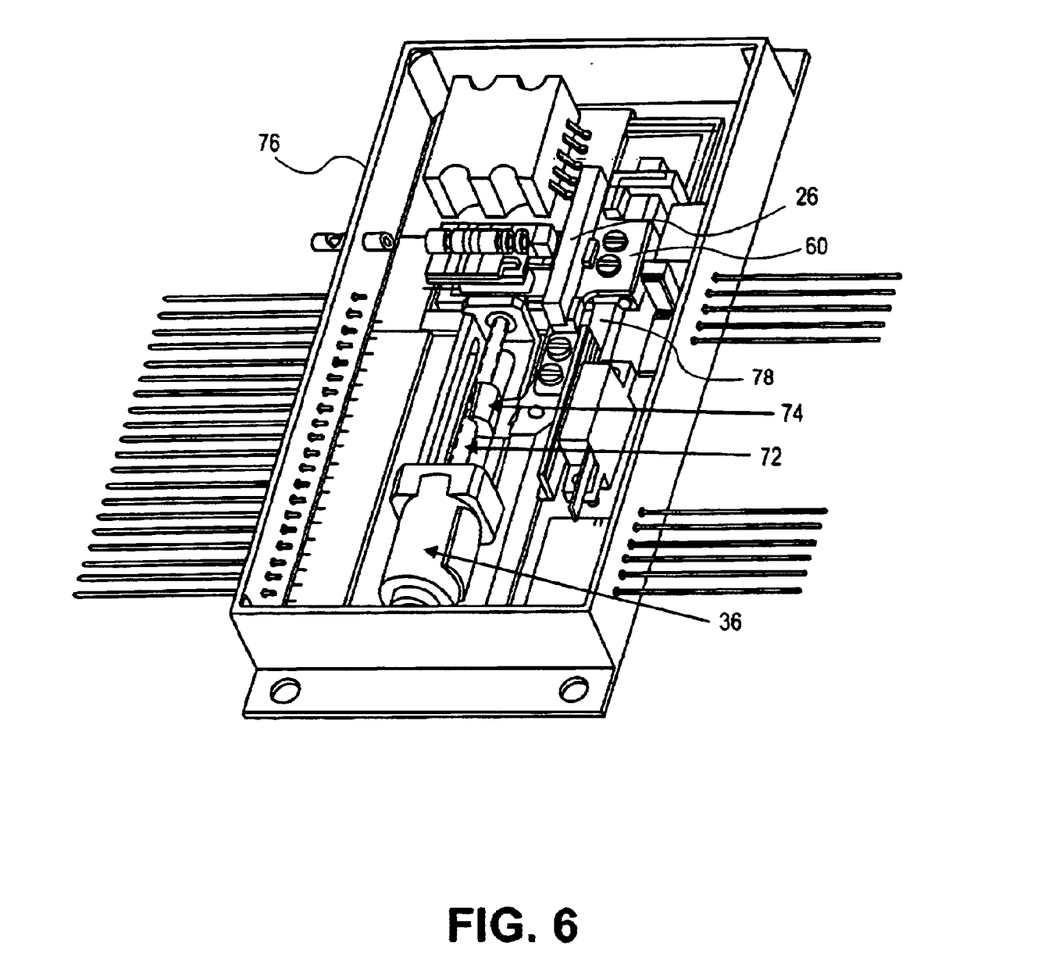
FIG. 6 is a plan view of an external cavity laser showing one adaptation of an etalon mount according to the present invention.

FIG. 6 is a plan view of an external cavity laser 10 according to the present invention and showing one adaptation of mount 60 within the apparatus. In this example, driver 36 is in the form of a drive motor having a lead screw extending therefrom which functions as the drive shaft. A drive nut 74 is threadably mounted on the lead screw 72 and is prevented from rotating relative to frame 76 by virtue of its connection to slide 78. Thus upon rotation of the lead screw 72 ads effected by motor 36, the drive nut 74 is translated in one of two directions depending upon the direction of rotation of the lead screw 72. Slide 78 is connected or fixed to mount 60, which has etalon 26 mounted thereto in a manner as described above. In this way, a drive train is established for controllably translating the etalon 26. Positioning feedback through controller 38 completes the loop for controlling the operation of the motor to establish a desired position of the etalon in the optical path.

The index of refraction and the physical thickness of each layer of the etalon will vary with temperature. Thus, the effective index of refraction of the overall etalon 26 varies with temperature. The result of such variations is a variation with temperature of the wavelength that is emitted from the etalon 26, for any given position. This phenomenon is known as thermal wavelength drift (TWD) and it results from at least two temperature dependent factors. One factor is the temperature induced variation in the effective index of refraction of each individual layer 46, 48, 50, and a second factor is variation in the thickness of each individual layer 46, 48, 50, since these layers may expand and become relatively thinner (such as with increasing temperature for example) or shrink or compress and become relatively thicker. Of course, a change in thickness changes the optical wavelength of that component. The optical thickness of any layer therefore varies with temperature. Although efforts have been made to minimize this effect, through selection of complementary materials for the various layers and the like, the effect has not been eliminated. Lasers which can be tuned for entire telecommunications bands, and which operate over typical required temperatures, require additional adjustment of the tunable element's position to compensate for TWD due to changes in operating temperature.

According to the present invention, a laser light source is passed through the etalon 26 at a predetermined position, which is typically the center of the tuning range (e.g., 1546.5 nm, in this case), with the etalon 26 being held in a fixed position and prevented from translating transversely to the optical path, or in any other translational or rotational direction of movement. The center of the pass band emitted from the etalon 26 is measured and plotted against the temperature at which the test was performed. These steps are then repeated, while holding everything constant except the temperature. Measurements are generally taken over the whole temperature range over which the assembly will be expected to operate, e.g., from about −5° C. to about 70° C. in increments ranging from about 1° to 20° C. and more typically about 5 to 10° C., with each different temperature being plotted in association with the location of the center of the pass band. This information is stored in non-volatile memory 39 in controller 38 as a look up table to be used for compensating for thermal wavelength drift.

Figure 7A:
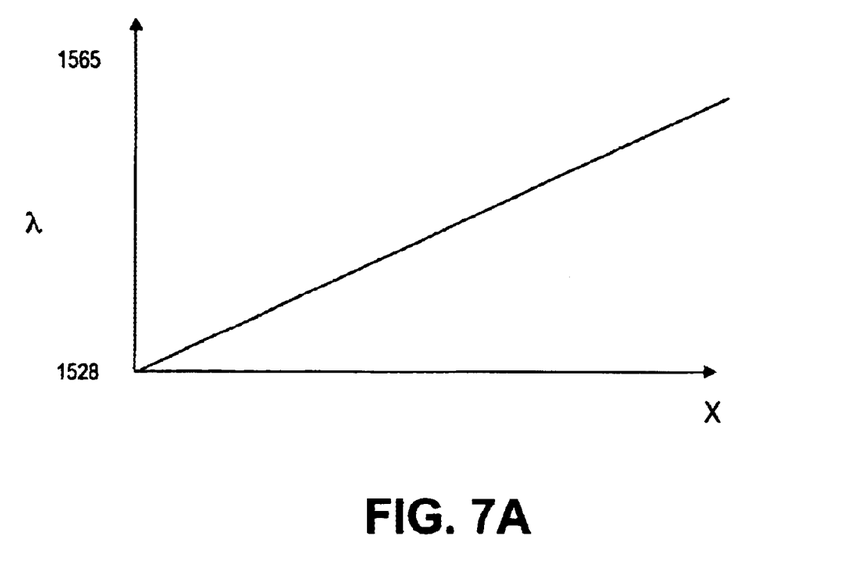
FIG. 7A is a graphical representation of wavelength/linear position data obtained from testing of a thin film etalon according to the present invention.
Figure 7B:
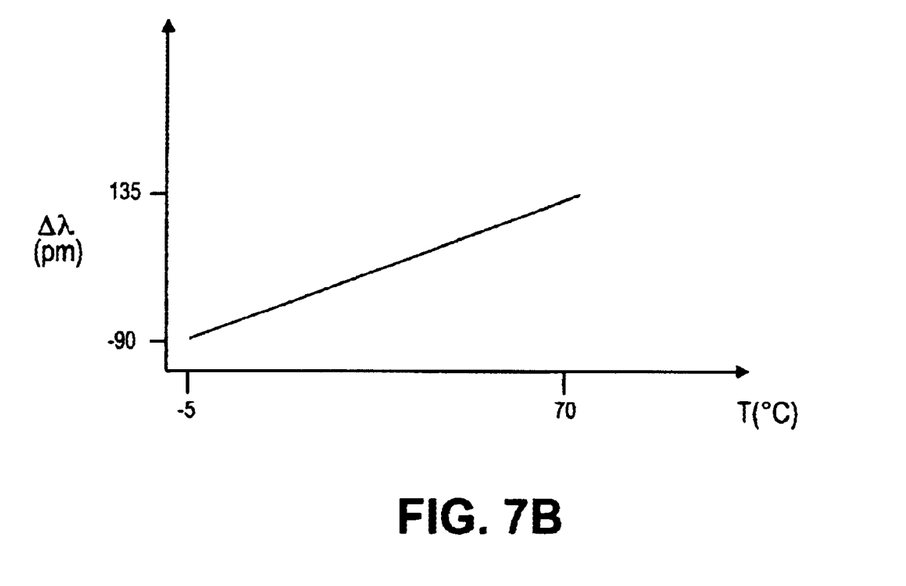
FIG. 7B is a graphical representation of the variation of the center of the passband from the center position measured at the baseline temperature with regard to a thin film etalon according to the present invention.

Additionally, laser light is passed through the etalon 26 at one end thereof, and a resultant wavelength of the pass band is measured and plotted against the linear position of the etalon 26. Then the etalon is incrementally translated to what is expected to be the next channel selection and the steps of passing the laser light, measuring the wavelength of the pass band and recording the wavelength as a function of the linear position are repeated. These steps are repeated for every useable channel over the length of the etalon 26 and wavelength/linear position information is recorded in non-volatile memory 39 of controller 38 as a look up table. A graphical representation of the wavelength/linear position data stored in the lookup table is shown in FIG. 7A, where the X-axis plots the linear distance/positioning of the etalon 26 in mm, where a typical length of an etalon can extend about 14 to 18 mm, more typically about 16 mm, while the Y-axis plots the resultant wavelengths, in nm, at each given linear location along the etalon 26. Similarly, FIG. 7B is a graphical representation of the variation of the center of the passband from the center position measured at the baseline temperature, typically about room temperature or 25° C. Values for wavelength correction typically are about 3 pm/° C. over the temperature range described, giving a total range of about −90 pm (−0.09 nm) to about +135 pm (+0.135 nm) for the corresponding temperature range of about −5° C. to about 70° C. Tuning compensation to 50 pm or less is desirable In practice, external cavity laser 10 is hermetically sealed (not shown) and a temperature sensor 35, typically a thermocouple (although a thermistor may alternatively be used, for example) is provided within the sealed environment to provide feedback to the controller 38 as to the temperature of the components therein, and thus the temperature that the etalon 26 is experiencing. The enclosure of an external cavity laser within a hermetically sealed container is described in U.S. patent application Ser. No. 09/900,423 entitled "Hermetically Sealed External Cavity Laser System and Method" to inventors Sell et al., filed concurrently herewith commonly assigned and incorporated herein by reference. Upon selection of a particular channel or wavelength by an operator of the laser, the controller references the look up table in memory 39 which stores the position data of the etalon relative to wavelengths. This reference provides the proper position of the etalon 26 under baseline conditions, i.e., without regard to the temperature, and might be referred to as a gross positioning data point. Additionally, the controller 38 references the lookup table in nonvolatile memory 39 which stores the temperature coefficients of tuning from which the controller can calculate an adjustment in the position in go the etalon 26 to compensate for thermal wavelength drift as described above.

The following example is put forth so as to provide those of ordinary skill in the art with a complete disclosure and description of how to make and use the present invention, and are not intended to limit the scope of what the inventors regard as their invention nor is it intended to represent that the example below was the only example developed. Efforts have been made to ensure accuracy with respect to numbers used (e.g. thicknesses.) but some experimental errors and deviations should be accounted for

EXAMPLE

One implementation of the etalon 26 according to the present invention, at the central wavelength of 1545 nm, consists of the 32 layers listed in the Table below. The physical thickness of the layers varies by about ±1.5 percent to provide a variation in the central wavelength of the band pass of about 3 percent. This variation, ideally, is a linear change on either side of the center of the filter. The change occurs over the scan distance of the filter. The layer thickness (Thickness) is in nm. Layer number 1 is contacting a silica substrate with an index of refraction (Index) of 1.44. Layer 32 is exposed to air.

TABLE

| Number | Thickness | Index |
|--------|-----------|-------|
| 1 | 183.06 | 2.11 |
| 2 | 268.23 | 1.44 |
| 3 | 183.06 | 2.11 |
| 4 | 268.23 | 1.44 |
| 5 | 183.06 | 2.11 |
| 6 | 268.23 | 1.44 |
| 7 | 183.06 | 2.11 |
| 8 | 268.23 | 1.44 |
| 9 | 183.06 | 2.11 |
| 10 | 268.23 | 1.44 |
| 11 | 183.06 | 2.11 |
| 12 | 268.23 | 1.44 |
| 13 | 183.06 | 2.11 |
| 14 | 268.23 | 1.44 |
| 15 | 183.06 | 2.11 |
| 16 | 536.46 | 1.44 |
| 17 | 183.06 | 2.11 |
| 18 | 268.23 | 1.44 |
| 19 | 183.06 | 2.11 |
| 20 | 268.23 | 1.44 |
| 21 | 183.06 | 2.11 |
| 22 | 268.23 | 1.44 |
| 23 | 183.06 | 2.11 |
| 24 | 268.23 | 1.44 |
| 25 | 183.06 | 2.11 |
| 26 | 268.23 | 1.44 |
| 27 | 183.06 | 2.11 |
| 28 | 268.23 | 1.44 |
| 29 | 183.06 | 2.11 |
| 30 | 268.23 | 1.44 |
| 31 | 183.06 | 2.11 |
| 32 | 268.23 | 1.44 |

While the present invention has been described with reference to the specific embodiments thereof, it should be understood by those skilled in the art that various changes may be made and equivalents may be substituted without departing from the true spirit and scope of the invention. In addition, many modifications may be made to adapt a particular situation, material, composition of matter, process, process step or steps, to the objective, spirit and scope of the present invention. All such modifications are intended to be within the scope of the claims appended hereto.

That which is claimed is:

1. A laser, comprising:
   a gain medium to generate an optical beam along an optical path;
   a cavity having a reflective element positioned in said optical path to reflect said optical beam; and
   a tapered, thin film interference filter positioned in said optical path between said gain medium and said reflective element.

2. The laser of claim 1, further comprising a driver operably connected to said tapered, thin film interference filter and adapted to adjustable position said tapered thin film interference filter in said optical path.

3. The laser of claim 2, wherein said driver is adapted to linearly translate said thin film interference filter in directions normal to said optical path.

4. The laser of claim 1, wherein said tapered, thin film interference filter comprises at least a first tapered spacer layer, a tapered first quarter wave layer stack positioned adjacent a first side of said spacer layer, and a tapered second quarter wave layer stack positioned adjacent a second side of said spacer layer, wherein each said spacer layer has an optical wavelength which is an odd integral multiple of a half wavelength of light to be passed therethrough.

5. The laser of claim 4, further comprising a second tapered spacer layer, with a first side of said second tapered spacer layer adjacent said second quarter wave layer stack opposite said first tapered spacer layer; and a third quarter wave layer stack positioned adjacent a second side of said second spacer layer.

6. The laser of claim 4, wherein said tapered, thin film interference filter comprises a tapered half wave spacer layer, a tapered first quarter wave layer stack positioned adjacent a first side of said half wave spacer layer, and a tapered second quarter wave layer stack positioned adjacent a second side of said half wave spacer layer.

7. The laser of claim 6, wherein said first and second tapered quarter wave layer stacks each comprise a plurality of high/low refractive index pairs, each of said high/low refractive index pairs including a high index layer and a low index layer.

8. The laser of claim 7, wherein said high index layer in each said high/low refractive index pair has a greater thickness than each said low index layer, respectively.

9. The laser of claim 7, wherein said high index layer in each said high/low refractive index pair has a lesser thickness than said low index layer, respectively.

10. The laser of claim 1, wherein said tapered, thin film interference filter comprises thin dielectric films.

11. A tuning element for an external cavity laser, comprising:
    a tapered half wave spacer layer;
    a tapered first quarter wave layer stack positioned adjacent a first side of said half wave spacer layer; and
    a tapered second quarter wave layer stack positioned adjacent a second side of said half wave spacer layer.

12. The tuning element of claim 11, wherein said layers comprise dielectric layers.

13. The tuning element of claim 11, wherein said first and second tapered quarter wave layer stacks each comprise a plurality of high/low refractive index pairs, each of said high low refractive index pairs including a high index layer and a low index layer.

14. The tuning element of claim 13, wherein said high index layer in each said high/low refractive index pair has a greater thickness than each said low index layer, respectively.

15. The tuning element of claim 13, wherein said high index layer in each said high/low refractive index pair has a lesser thickness than said low index layer, respectively.

16. A tuning element for an external cavity laser, comprising:
   at least one tapered spacer layer,
   a tapered first quarter wave layer stack positioned adjacent a first side of said spacer layers; and
   a tapered second quarter wave layer stack positioned adjacent a second side of said spacer layer, wherein each said spacer layer has an optical wavelength which is an odd integral multiple of a half wavelength of light to be passed therethrough.

17. A method for tuning a laser, comprising:
   (a) providing a tapered thin film interference filter including a tapered half wave spacer layer, a tapered first quarter wave layer stack positioned adjacent a first side of said half wave spacer layer, and a tapered second quarter wave layer stack positioned adjacent a second side of said half wave spacer layer; and
   (b) adjustably positioning said tapered thin film interference filter in an optical path defined by a beam associated with said laser.

18. The method for tuning of claim 17, wherein said adjustably positioning comprises translating said thin film interference filter in at least one direction substantially normal to said optical path.

19. The method for tuning of claim 17, wherein said adjustably positioning comprises rotating said thin film interference filter in a plane substantially normal to said optical path.

20. The method for tuning of claim 17, wherein said adjustably positioning comprises tilting said thin film interference filter, wherein said tilting comprises rotation about an axis substantially normal to said optical path.

21. A method for tuning an external cavity laser, comprising the steps of:
   (a) providing a tapered thin film interference filter including tapered spacer layers and (n+1) quarter wave layer stack positioned adjacent and separating said spacer layers, wherein n is a positive integer; and
   (b) adjustably positioning said tapered thin film interference filter in an optical path defined by a beam associated with said external cavity laser.

22. A method for tuning a laser, comprising:
   (a) providing a tapered thin film interference filter including at least one tapered spacer layer, a tapered layer stack positioned adjacent a first side of each said spacer layer, and a tapered layer stack positioned adjacent a second side of each said spacer layer, wherein said layers define a Fabry-Perot interference filter; and
   (b) adjustably positioning said tapered thin film interference filter in an optical path defined by a beam associated with said laser.

23. The method of claim 22, wherein each said spacer layer has an optical wavelength which is an odd integral multiple of a half wavelength of light to be passed therethrough.

24. The method of claim 22, wherein each said layer stack comprises layers of quarter wavelength thickness.

25. A tuning element for an external cavity laser, comprising:
   a tapered half wave spacer layer;
   a tapered first quarter wave layer stack positioned adjacent a first side of said half wave spacer layer; and
   a tapered second quarter wave layer stack positioned adjacent a second side of said half wave spacer layer,
   wherein a wavelength range for a center wavelength of a pass band through said tuning element varies across at least one communication band, the full width at half maximum of the pass band is about 1.0 nm to 1.5 nm, the scan distance is 14 mm or greater, the tuning rate is 3.0 nm per mm or less, and the tuning element operates with a laser mean which is 0.40 mm or less in diameter across the $1/e^2$ power points.

26. A laser apparatus, comprising:
   (a) a gain medium configured to emit a light beam along an optical path;
   (b) a cavity having a reflector positioned in said optical path; and
   (c) tapered thin film interference filter means, positioned in said optical path, for selecting a laser output wavelength.

27. The laser apparatus of claim 26, further comprising grid generator means for defining wavelength channels, said grid generator means positioned in said optical path.

28. The laser apparatus of claim 26, further comprising drive means for positionally adjusting said tapered thin film interference filter means in said optical path, said drive means operatively coupled to said tapered thin film interference filter means.

* * * * *

UNITED STATES PATENT AND TRADEMARK OFFICE
CERTIFICATE OF CORRECTION

PATENT NO. : 6,717,965 B2 Page 1 of 1
DATED : April 6, 2004
INVENTOR(S) : Hopkins II et al.

It is certified that error appears in the above-identified patent and that said Letters Patent is hereby corrected as shown below:

<u>Column 15,</u>
Line 8, delete "layers" and insert -- layer --.

Signed and Sealed this

First Day of June, 2004

JON W. DUDAS
*Acting Director of the United States Patent and Trademark Office*